US005759900A

United States Patent [19]

Suh

[11] Patent Number: 5,759,900
[45] Date of Patent: Jun. 2, 1998

[54] METHOD FOR MANUFACTURING MOSFET

[75] Inventor: Jai Bum Suh, Chungcheongbuk-do, Rep. of Korea

[73] Assignee: LG Semicon Co., Ltd., Chungcheongbuk-Do, Rep. of Korea

[21] Appl. No.: 708,742

[22] Filed: Sep. 5, 1996

[30] Foreign Application Priority Data

Dec. 14, 1995 [KR] Rep. of Korea .................. 49773/1995

[51] Int. Cl.⁶ ........................................... H01L 21/336
[52] U.S. Cl. ...................... 438/305; 438/592; 438/656
[58] Field of Search ............................ 437/41 GS, 44, 437/190, 192; 438/303, 305, 306, 307, 592, 656, 922

[56] References Cited

U.S. PATENT DOCUMENTS

| | | | |
|---|---|---|---|
| 4,907,048 | 3/1990 | Huang | 257/344 |
| 5,061,647 | 10/1991 | Roth et al. | 438/592 |
| 5,102,815 | 4/1992 | Sanchez | 437/44 |
| 5,175,119 | 12/1992 | Matsutani | 437/44 |
| 5,304,504 | 4/1994 | Wei et al. | 437/44 |
| 5,583,067 | 12/1996 | Sanchez | 438/305 |

OTHER PUBLICATIONS

Fang, H. et al., "Low-Temperature Furnace-Grown Reoxidized Nitrided Oxide Gate Dielectrics as a Barrier to Boron Penetration", IEEE Electron Device Letters, 13(4): 217–219 (1992).

Wolf et al., "Chemical Vapor Deposition of Amorphous and Polycrystalline Films," Silicon Processing for the VLSI Era—vol. 1 (1986), p. 181.

Primary Examiner—Charles L. Bowers, Jr.
Assistant Examiner—Toniae M. Thomas
Attorney, Agent, or Firm—Morgan, Lewis & Bockius LLP

[57] ABSTRACT

A method of manufacturing a field effect transistor (FET) includes the steps of: sequentially forming a conductive layer and a semiconductor layer on a first conductivity type substrate; patterning the semiconductor layer to form a gate electrode; implanting second conductivity type impurity ions at a low concentration into a surface of the substrate using the gate electrode as a mask, to thereby form low-concentration impurity regions in the substrate; forming and patterning an insulating layer on an overall surface of the substrate to form insulating side-wall spacers on side-walls of the gate electrode; and implanting second conductivity type FET impurity ions at a high concentration into a surface of the substrate using the gate electrode and insulating side-wall spacers as an etch-mask, to thereby form high-concentration impurity regions in the substrate.

10 Claims, 2 Drawing Sheets

000

METHOD FOR MANUFACTURING MOSFET

BACKGROUND OF THE INVENTION

1. Field of the Invention

The present invention relates to a metal oxide semiconductor field effect transistor (MOSFET) and, more particularly, to a method of manufacturing a field effect transistor (FET) suitable for improving aspects of the device relating to the so-called short channel characteristic.

2. Discussion of the Related Art

Integration technology has undergone a remarkable progression toward minimizing semiconductor features to submicron units. Nonetheless, an undesirable variation of circuit characteristics occurs as the size of the circuit becomes smaller and the interval between the source and the drain of the transistor decreases. A representative effect thereof is the short channel effect.

With reference to the attached drawings, a conventional method for manufacturing an FET is illustrated as follows. FIGS. 1A to 1D are sectional views showing the manufacturing procedure of a conventional field effect transistor.

First, as illustrated in FIG. 1A, a nitride layer (not shown) is deposited on an n-type semiconductor substrate 1. A photo-sensitive layer (not shown) is coated on the upper portion of the nitride layer. Then, the nitride layer is selectively removed by a photolithography process to define a field region and an active region.

Field ions are implanted into the field region of the n-type semiconductor substrate 1, and a heat-process is performed thereon. Then, a field oxide layer 2 is formed through local oxidation of silicon (LOCOS). Next, ions for controlling a threshold voltage (Vt) are implanted into the active region.

As illustrated in FIG. 1B, the gate oxide layer 3 is grown on the semiconductor substrate 1 of the active region, and an undoped polysilicon 4 (i.e., not doped with impurities) is deposited on the upper portion of a gate oxide layer 3. A photo-sensitive layer (not shown) is deposited on the upper portion of the polysilicon 4. Unnecessary portions of polysilicon 4 are selectively removed through a photolithography and etching process to form a gate electrode 4a. Here, when the unnecessary portions of polysilicon 4 are removed, the polysilicon 4 should be etched to a predetermined depth so as not to expose the semiconductor substrate 1 of the active region.

As illustrated in FIG. 1C, low-concentration p⁻-type impurity ions for forming an LDD (lightly doped drain) region are implanted into the overall surface including the gate electrode 4a to form the p-type impurity diffusion region 5. Then, an oxide layer (not shown) is deposited through a chemical vapor deposition (CVD) method on the overall surface of the substrate including the gate electrode 4a.

As illustrated in FIG. 1D, gate side-walls 6 are formed on both sides of the gate electrode 4a by etching back the oxide layer. The polysilicon 4 remaining on both sides of the gate side-walls 6 is etched using the gate side-walls 6 as a mask to expose the gate oxide layer (3).

P⁺-type impurity ions are then implanted at a high-concentration to form high-concentration p⁺-type source/drain impurity region 7 on the n-type semiconductor substrate 1 at both sides of the gate electrode 4a.

However, in the above-mentioned conventional method for manufacturing an FET, in the case where boron ions having a small atom size are implanted, such particles permeate into the gate oxide layer and the substrate along the grain boundary of the polysilicon. This changes the threshold voltage (Vt) and lowers the reliability of the gate oxide layer.

SUMMARY OF THE INVENTION

Accordingly, the present invention is directed to a method for manufacturing an MOSFET that substantially obviates one or more of the problems due to limitations and disadvantages of the related art.

An object of the present invention is to provide a method of manufacturing an FET suitable for improving aspects of the device relating to the short channel characteristic and for enhancing the reliability of the gate oxide layer.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the method of manufacturing an FET includes the steps of: sequentially forming a conductive layer and a semiconductor layer on a first conductivity type substrate; patterning the semiconductor layer to form a gate electrode; implanting impurity ions of a second conductivity type at a low concentration into a surface of the substrate using the gate electrode as a mask, the implanting step forming low-concentration impurity regions in the substrate; forming and patterning an insulating layer on an overall surface of the substrate to form insulating side-wall spacers on side-walls of the gate electrode; and implanting second conductivity type FET impurity ions at a high concentration into a surface of the substrate using the gate electrode and insulating side-wall spacers as an etch-mask, to thereby form high-concentration impurity regions in the substrate.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF PREFERRED EMBODIMENT

Reference will now be made in detail to the preferred embodiments of the present invention, examples of which are illustrated in the accompanying drawings.

With reference to the attached drawings, an FET manufacturing method in accordance with the present invention will be described below.

Figure 1A:
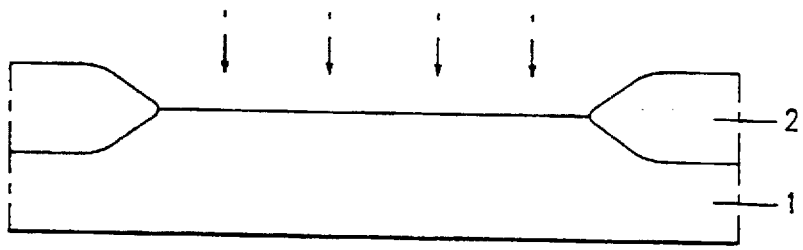
FIGS. 1A to 1D are sectional views showing the manufacturing procedure of a conventional field effect transistor.
Figure 1B:
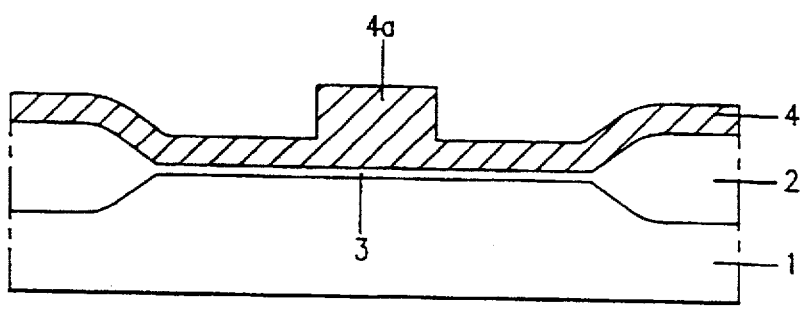
Figure 1C:
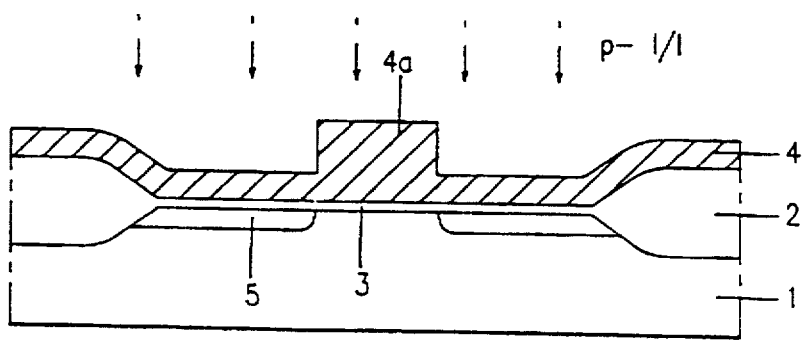
Figure 1D:
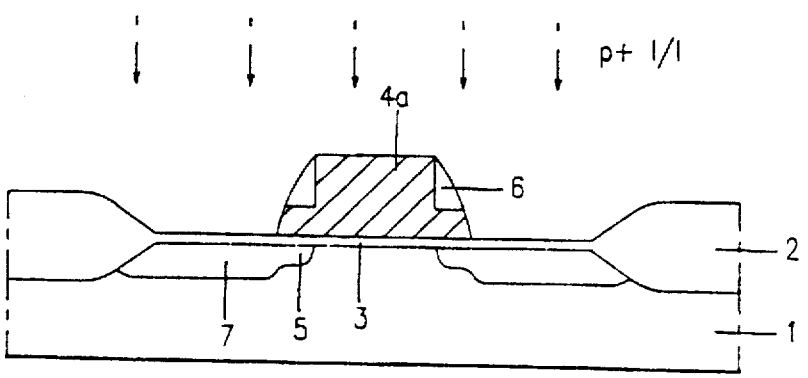
Figure 2A:
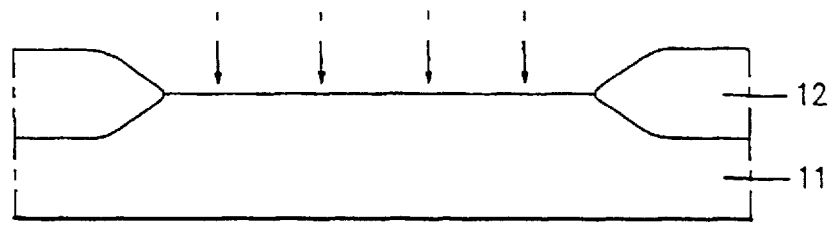
FIGS. 2A to 2D are sectional views showing a manufacturing procedure of a field effect transistor in accordance with the present invention.

First, as illustrated in FIG. 2A, a field oxide layer 12 is formed by LOCOS on an n-type semiconductor substrate 11. That is, a nitride layer (not shown) is deposited on the n-type semiconductor substrate 11, and a photosensitive layer (not shown) is coated on the nitride layer. Then, the photosensitive layer is patterned to define an active region where a device will be formed, and a field region serves as a separation region between devices. The nitride layer of the field region is selectively removed through a photolithography and etching process.

Field ions are implanted using the nitride layer as a mask, and a heat-process is applied thereto. Then, the nitride layer is reduced to form a field oxide layer 12 using LOCOS. Subsequently, ions for controlling a threshold voltage (Vt) are implanted in the active region of the n-type semiconductor substrate 11, as shown in FIG. 2A.

Figure 2B:
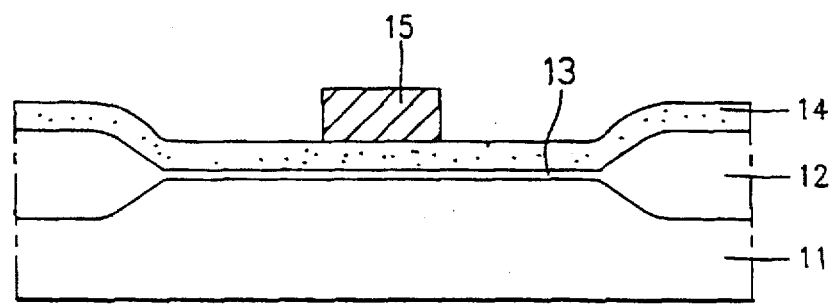

As illustrated in FIG. 2B, a gate oxide layer 13 is formed on the n-type semiconductor substrate 11 of the active region. A buffer layer 14 is formed on the overall surface of the gate oxide layer 13 including the field oxide layer 12. The buffer layer 14, made of a refractory metal using either TiN or TiW, prevents a high-concentration p$^+$-type impurity from permeating into the gate oxide layer 13 and a channel region. An undoped polysilicon layer (i.e., not doped with any impurities) is formed on the upper portion of the buffer layer 14.

A photosensitive layer (not shown) is coated on the upper portion of the polysilicon layer, and then unnecessary portions of the polysilicon layer are selectively removed by photolithography and etching to form a gate electrode 15.

Figure 2C:
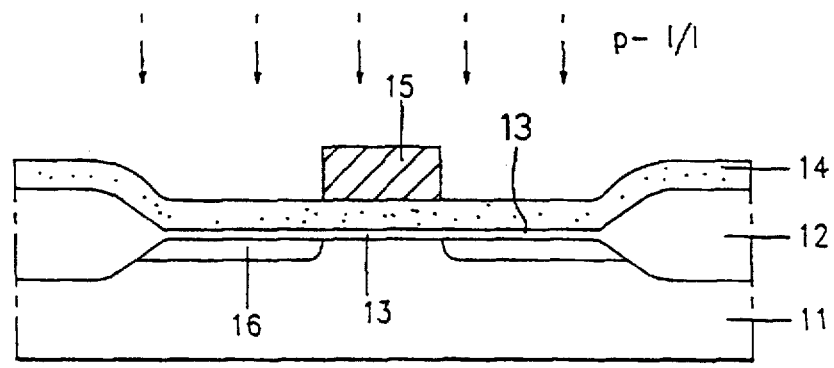

As illustrated in FIG. 2C, a p$^-$-type impurity is implanted at a low concentration using the gate electrode 15 as a mask to form an LDD (lightly doped drain) region, and to thereby form a low-concentration p$^-$-type impurity diffusion area. Here, the minus (−) sign represents a low concentration, and the plus (+) sign represents a high concentration.

Figure 2D:
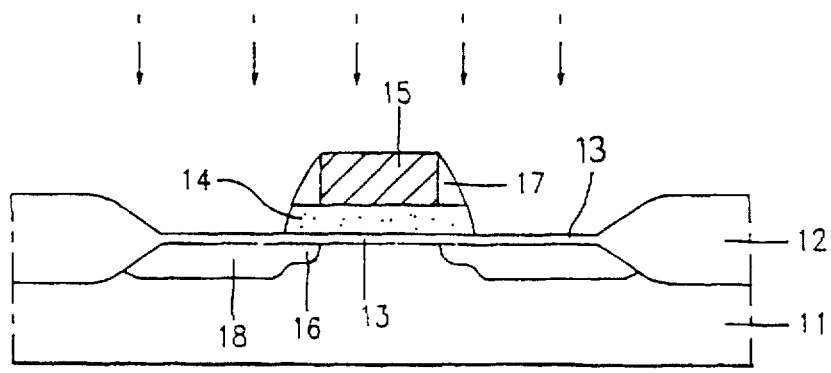

Referring to FIG. 2D, an oxide layer (not shown) is deposited on the overall surface of buffer layer 14 and the gate electrode 15. For example, the oxide layer may be deposited using a chemical vapor deposition (CVD) procedure.

Unnecessary portions of the oxide layer are removed using an etch back process to form gate side-wall spacers 17 on both side-walls of the gate electrode 15. As an example, the gate side-wall spacers 17 may be formed from an oxide or a nitride layer. Unnecessary portions of the buffer layer 14 are then removed using the gate side-wall spacers 17 as a mask. Thereafter, p$^+$-type impurity ions at a high concentration are implanted thereto. The p-type impurity ions may be, for example, of the boron type. Accordingly, a p$^+$-type source/drain impurity diffusion region 18 is formed in the n-type semiconductor substrate 11 at both sides of the gate electrode 15. In addition, p-type impurity ions are implanted into the undoped gate electrode 15. Therefore, the polysilicon becomes the conductive layer and functions as a gate electrode.

The embodiment illustrated in FIGS. 2A to 2D is a p conductivity type metal oxide semiconductor (PMOSFET). The method of the present invention can also be applied to an n conductivity type metal oxide semiconductor (NMOSFET). In this case, the substrate is of the p conductivity type and the source/drain region is of the n conductivity type.

Accordingly, the present invention improves short channel characteristics and enhances the reliability of the gate oxide layer by preventing p$^+$-type impurity ions from permeating into areas such as the gate oxide layer and substrate along the grain boundary of the polysilicon.

The method of manufacturing an FET in accordance with the present invention has the following advantages and effects. The reliability of a gate oxide layer is enhanced because impurities are prevented from permeating into the gate oxide region and the channel region for the case where high concentration ions are being implanted. Also, the present invention prevents variations in the threshold voltage and improves aspects of the device relating to the short channel effect.

It will be apparent to those skilled in the art that various modifications and variations can be made in the method for manufacturing a MOSFET of the present invention without departing from the spirit or scope of the invention. Thus, it is intended that the present invention cover the modifications and variations of this invention provided they come within the scope of the appended claims and their equivalents.

What is claimed is:

1. A method of manufacturing a field effect transistor, the method comprising the steps of:

sequentially forming a conductive layer and an undoped semiconductor layer on a substrate, wherein the conductive layer is formed of one of TiN and TiW;

patterning the undoped semiconductor layer;

implanting first impurity ions into a surface of the substrate using the undoped semiconductor layer as a mask, thereby forming first impurity regions in the substrate;

forming insulating side-wall spacers on side-walls of the undoped semiconductor layer; and implanting second impurity ions into a surface of the substrate and the undoped semiconductor layer using the insulating side-wall spacers as a mask, thereby forming second impurity regions in the substrate.

2. The manufacturing method as claimed in claim 1, wherein the conductive layer is a buffer layer and the steps of forming the conductive layer and the undoped semiconductor layer result in the buffer layer being located between the substrate and the undoped semiconductor layer.

3. The manufacturing method as claimed in claim 1, wherein the undoped semiconductor layer is formed from undoped polysilicon.

4. A method of manufacturing a field effect transistor, the method comprising the steps of:

sequentially forming a conductive layer and a semiconductor layer on a substrate, wherein the conductive layer is formed of one of TiN and TiW;

patterning the semiconductor layer;

implanting first impurity ions into a surface of the substrate using the semiconductor layer as a mask, thereby forming first impurity regions in the substrate;

forming insulating side-wall spacers on side-walls of the semiconductor layer; and implanting second impurity ions into a surface of the substrate and the semiconductor layer using the insulating side-wall spacers as a mask, thereby forming second impurity regions in the substrate.

5. The manufacturing method as claimed in claim 1, wherein the first impurity ions are one of P$^-$ type and N$^-$ type.

6. The manufacturing method as claimed in claim 1, wherein the insulating side-wall spacers are formed from one of oxide and nitride.

7. The manufacturing method as claimed in claim 1, further comprising the step of forming a thin oxide layer as a gate insulating layer before forming the conductive layer.

8. The manufacturing method as claimed in claim 1, wherein the second impurity ions are one of P$^+$ type and N$^+$ type.

9. The manufacturing method as claimed in claim 1, wherein the first impurity ions are implanted into the undoped semiconductor layer, resulting in the undoped semiconductor layer being doped with impurities.

10. The manufacturing method as claimed in claim 2, wherein the buffer layer prevents the second impurity ions from penetrating into a channel region.

* * * * *